(12) United States Patent
Ramalingam et al.

(10) Patent No.: US 10,516,333 B2
(45) Date of Patent: Dec. 24, 2019

(54) SLEW CONTROL FOR HIGH-SIDE SWITCH

(71) Applicant: Microchip Technology Incorporated, Chandler, AZ (US)

(72) Inventors: Sureshkumar Ramalingam, Coimbatore (IN); Udo Karthaus, Heilbronn (DE)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/916,421

(22) Filed: Mar. 9, 2018

(65) Prior Publication Data

US 2018/0294716 A1 Oct. 11, 2018

(51) Int. Cl.
| | | |
|---|---|---|
| *H03B 1/00* | (2006.01) | |
| *H02M 3/07* | (2006.01) | |
| *H02M 1/096* | (2006.01) | |
| *H03K 17/06* | (2006.01) | |
| *H03K 17/16* | (2006.01) | |
| *H02M 1/08* | (2006.01) | |
| *H02M 1/00* | (2006.01) | |

(52) U.S. Cl.
CPC ............... *H02M 3/07* (2013.01); *H02M 1/08* (2013.01); *H02M 1/096* (2013.01); *H03K 17/063* (2013.01); *H03K 17/163* (2013.01); *H02M 2001/0006* (2013.01); *H02M 2001/0029* (2013.01); *H03K 2217/0063* (2013.01)

(58) Field of Classification Search
CPC ........ H03F 3/195; H03F 3/245; H03F 1/0227; H03K 17/166
See application file for complete search history.

(56) References Cited

U.S. PATENT DOCUMENTS

| | | | |
|---|---|---|---|
| 5,426,334 A | 6/1995 | Skovmand | 327/427 |
| 6,072,289 A * | 6/2000 | Li | G11B 19/20 318/400.19 |
| 9,148,078 B2 | 9/2015 | Hattori | |
| 2002/0053890 A1* | 5/2002 | Gotou | G11B 19/20 318/400.19 |
| 2006/0164872 A1* | 7/2006 | Fukumoto | H02M 3/33523 363/21.04 |
| 2012/0126861 A1 | 5/2012 | Sasaki | 327/109 |
| 2013/0241601 A1 | 9/2013 | Chen et al. | 327/108 |
| 2014/0021932 A1* | 1/2014 | Ejury | G05F 3/02 323/311 |

OTHER PUBLICATIONS

International Search Report and Written Opinion, Application No. PCT/US2018/026686, 11 pages, dated Jun. 25, 2018.

* cited by examiner

*Primary Examiner* — Sibin Chen
(74) *Attorney, Agent, or Firm* — Slayden Grubert Beard PLLC

(57) ABSTRACT

A circuit for slew rate control for a high-side switch is disclosed. The circuit comprises a sample and level-shift circuit. The sample and level-shift circuit is connected to the high-side switch. The circuit further comprises a sampling capacitor, and the sampling capacitor is configured to sample an input voltage corresponding to the sample and level-shift circuit. Additionally, the circuit includes a charge-limiting circuit. The sampling capacitor is configured to charge a gate capacitance of the high-side switch. The charge-limiting circuit is configured to limit a rate of charge transferred to the gate capacitance of the high-side switch per unit time.

21 Claims, 5 Drawing Sheets

US 10,516,333 B2

SLEW CONTROL FOR HIGH-SIDE SWITCH

FIELD OF THE INVENTION

The present disclosure relates to transistor-based switches and, more particularly, to slew control for a high-side switch.

APPLICATION PRIORITY

The present application claims priority to Indian Application No. 201711012738, filed Apr. 10, 2017, the contents of which are hereby incorporated in their entirety.

BACKGROUND

High-side switches can be used to drive a variety of loads, and therefore can be used in a number of different applications. Typical systems and methods for driving a high-side switch utilize a charge-pump. A charge-pump is a DC to DC converter that uses capacitors as energy-storage elements to create either a higher- or lower-voltage power source. In regards to high-side switches, the charge-pump is relied on to supply other circuit components (such as amplifiers) in addition to supplying a DC current for driving the high-side switch. This method necessitates the use of large capacitors within the charge-pump to supply DC load currents. Large capacitors can take up valuable surface area if an on-chip integrated solution is required. To solve this problem, some systems implement external capacitors for supplying the DC current. While this reduces the required surface area of the chip, extra pins are then included to connect the external capacitors. Using a charge-pump design for driving a high-side switch is not conducive to situations that require a reduced chip size or situations that are cost sensitive and therefore require a reduced number of pins. Additionally, using a charge-pump design is not conducive to situations that require as few external components as possible, such as external capacitors, because the external components also add to the overall bill of materials (BOM) and cost.

Generally speaking, high-side switches include three main elements: a pass element, a gate-control block, and an input logic block. The pass element is usually a transistor which is typically a metal-oxide-semiconductor field-effect transistor (MOSFET) or a laterally diffused metal oxide semiconductor transistor (LDMOS). An LDMOS transistor is considered to be a type of MOSFET. The pass element operates in the linear region to pass the current from a power source to a load. The gate-control block provides a voltage to the gate of the pass element to switch it "on" or "off." The input logic block interprets the on/off signal and triggers the gate control block to switch the pass element "on" or "off."

In electronics, slew rate is defined as the change of voltage per unit of time. Exceeding a circuit's slew rate can cause signal distortion. Also, exceeding the slew rate can cause an increased amount of electromagnetic emissions (EME), thereby violating electromagnetic compatibility (EMC) standards, and potentially disturbing other electronic devices. Accordingly, the slew rate can place significant limitations on the operation of a corresponding circuit. Adding current limiters can provide some control over slew rate, but this solution still requires the use of a large charge pump.

FIG. 1 is a circuit-level schematic of a known system and method for driving a high-side switch with additional current limiters. As shown, a charge-pump 2 is connected to a current controller 4. The current controller 4 includes an amplifier 6 and a transistor 10. Here, the transistor 10 used is a p-channel metal-oxide semiconductor (pMOS). The current controller 4 is supplied by the charge-pump 2 and controls an output based on the voltage difference resulting from resistors 12, 24. The positive rail of the amplifier 6 is powered by the charge-pump 2 and the negative rail of the amplifier 6 is powered by a supply voltage 8. A current sensing resistor 12 is connected between the charge-pump 2 and the amplifier 6. A current-sensing FET 14 is connected between the amplifier 6 and an output pin 18. A high-side switch FET 16 has the drain side connected to the charge-pump 2, the gate side is connected to the output of the amplifier 6, via transistor 10, and the source side is connected to the output pin 18. The output pin 18 is used to connect the system to a circuit load 20. Additionally, a resistor 32 is connected between the gate side and the source side of the FET 16. The circuit further includes a clock generator 22. A resistor 24 is connected between the charge-pump 2 and the amplifier 6. The circuit further includes a load reference 26. Also shown, a FET 28 is connected in series with a resistor 30 for when the high-side switch FET 16 is turned "off." Current limiters 34 are used to provide some control over the slew rate of the high-side switch FET 16.

Still referring to FIG. 1, the charge-pump 2 needs to deliver a significant output current due to its connection to the amplifier 6 and the high-side switch FET 16. Quickly charging the gate of the high-side switch to the desired voltage $V_{GS}$ with the current controller 4 draws a significant amount of current from the charge-pump 2. Therefore, the charge-pump 2 includes relatively large capacitors, making it difficult to integrate the circuit of FIG. 1 onto a single chip. Large integrated capacitors increase the silicon die size and thereby product cost. Should the large capacitors be externally located, additional pins become necessary, and any external capacitors may increase the BOM cost, therefore increasing the cost of the overall system. Controlling the slew rate of the high-side switch FET 16 with the current limiters 34 results in the need for a large charge-pump 2.

Therefore what is needed is an improved system and method for controlling the slew rate of a high-side switch.

SUMMARY

The preceding needs are met via the presently disclosed system and method for controlling a high-side switch slew rate including a sampling and level-shift circuit.

An exemplary circuit for slew rate control for a high-side switch is disclosed. The circuit comprises a sample and level-shift circuit. The sample and level-shift circuit is connected to the high-side switch. The circuit further comprises a sampling capacitor, and the sampling capacitor is configured to sample an input voltage corresponding to the sample and level-shift circuit. Additionally, the circuit includes a charge-limiting mechanism, implementable as a circuit. The sampling capacitor is configured to charge a gate capacitance of the high-side switch. The charge-limiting mechanism is configured to limit a rate of charge transferred to the gate capacitance of the high-side switch per unit of time.

An exemplary method for controlling a slew rate of a high-side switch is disclosed. The method comprises supplying an input current to a sample and level-shift circuit. The method further includes sampling an input voltage. A sampling capacitor is configured for the sampling of the input voltage. Additionally, the method includes level-shifting the input voltage. The method includes charging a gate capacitance of the high-side switch using the sampling capacitor. Further, the method includes limiting a charge supplied to the sampling capacitor, the charge limited by at least one current sink.

DETAILED DESCRIPTION

Figure 1:
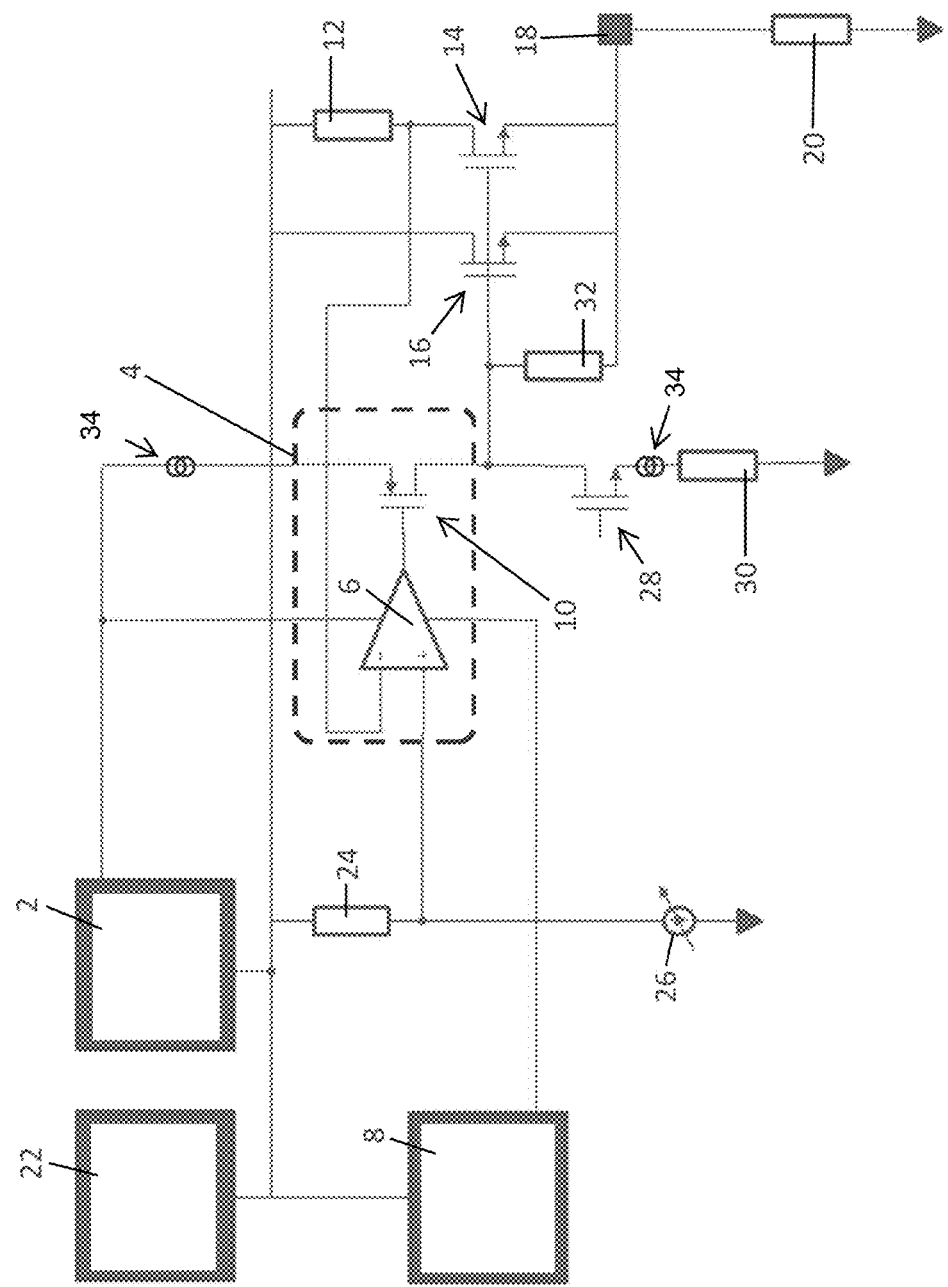
FIG. 1 is a circuit-level schematic of a known system and method for driving a high-side switch with current limiters.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives that fall within the scope of embodiments of the invention.

Embodiments of the present disclosure provide a system and a method for controlling the slew rate of a high-side switch, the high-side switch for use in selectively providing power to an output load.

Figure 2:
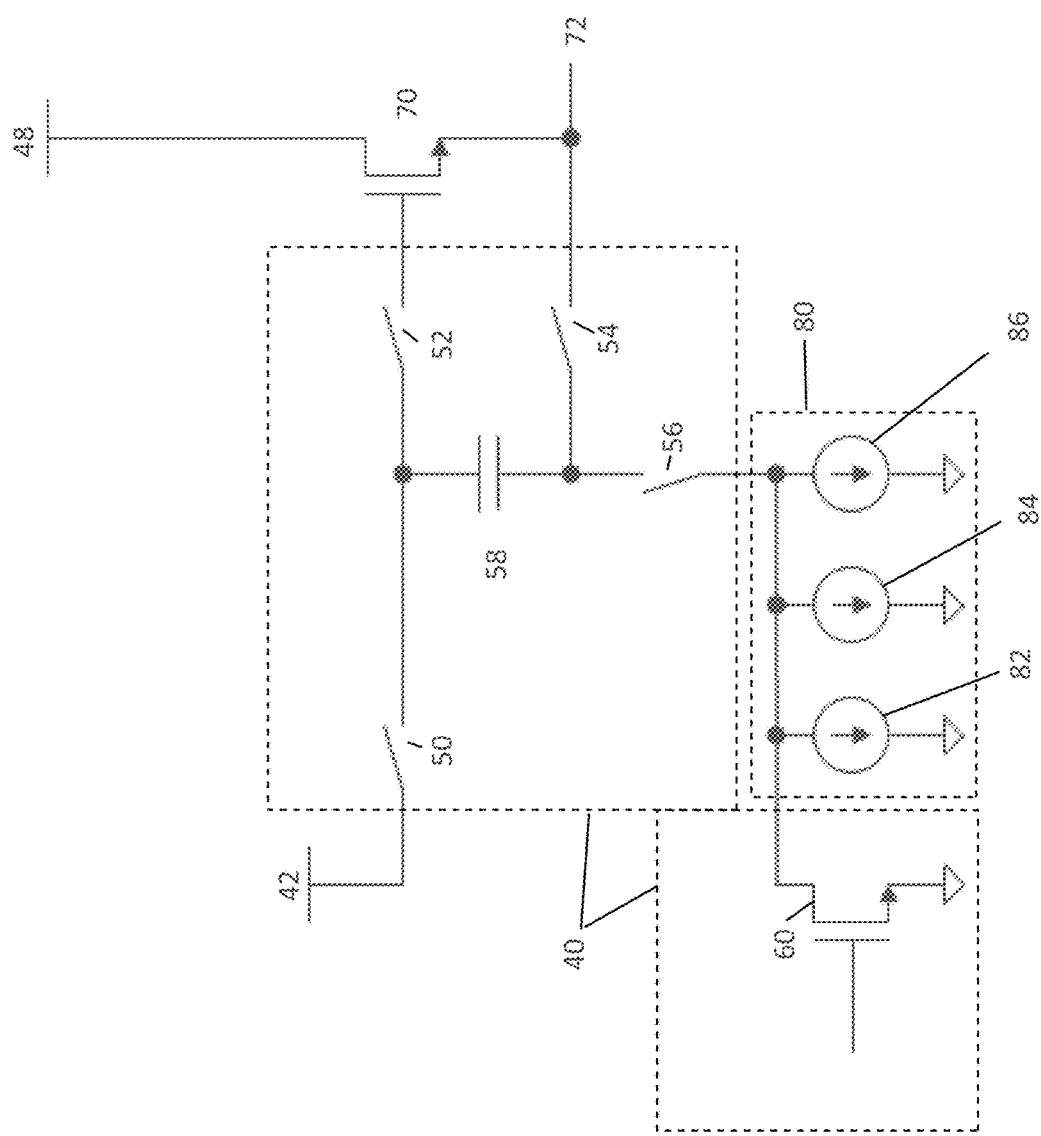
FIG. 2 is a circuit-level schematic of one embodiment of a system and method for controlling the slew rate of a high-side switch in accordance with the present disclosure.

FIG. 2 is a circuit-level schematic of one embodiment of a system and method for controlling a slew rate of a high-side switch in accordance with the present disclosure.

In one embodiment, a sample and level-shift circuit 40 may be provided. The sample and level-shift circuit 40 may be connected to a voltage supply 42. The voltage supply 42 may be the output of an amplifier (for example, an operational amplifier). Alternatively, the voltage supply 42 may supply a fixed or variable supply voltage. In certain embodiments, it may be beneficial for the voltage supply 42 to be 1.8, 2.5, 3.3, or 5 volts. Alternatively, any other voltage level may be supplied by the voltage supply 42. The sample and level-shift circuit 40 may include a plurality of switches 50, 52, 54, 56. The sample and level-shift circuit 40 may further include a sampling capacitor 58. Additionally, the sample and level-shift circuit 40 may include a field-effect transistor (FET) 60. A slew control 80 may include current sinks 82, 84, 86 that may be connected in parallel. The slew control 80 may be connected in parallel with the FET 60.

In one non-limiting example, as shown by FIG. 2, a high-side switch 70 may be an n-channel metal-oxide semiconductor field-effect transistor (nMOS transistor) or an n-channel laterally diffused metal oxide semiconductor transistor (nLDMOS transistor). An nLDMOS transistor is considered to be a type of nMOS transistor. In certain situations, it may be beneficial to use a different type of transistor. One output of the sample and level-shift circuit 40 may be connected to the gate side of the high-side switch 70. The drain side of the high-side switch 70 may be connected to a voltage supply 48. The output pin 72 may be connected to a circuit load. In certain non-limiting embodiments, a low-side switch may be included and connected to the output pin 72, such that the high-side switch 70 and the low-side switch constitute a half-bridge configuration.

Still referring to FIG. 2, the sample and level-shift circuit 40 may eliminate a need for a charge-pump when driving the high-side switch 70. The sampling capacitor 58 may sample the voltage of the voltage supply 42. The sampling capacitor 58 may then be used to charge the gate side capacitance of the high-side switch 70. The charging of the gate side capacitance may enable the high-side switch 70 to turn "on." In one non-limiting embodiment, when the high-side switch 70 is "on," an input voltage may be supplied to a circuit load.

In another non-limiting embodiment, the gate capacitance of the high-side switch 70 may serve as a holding capacitor. Accordingly, there may be no DC loading required for a holding capacitor. The sample and level-shift circuit 40 may not provide any DC current. In another non-limiting embodiment, an explicit hold capacitor may be connected in parallel to the gate capacitance of the high-side switch 70. Again, there may be no DC loading required for a holding capacitor.

In certain non-limiting embodiments, the voltage supplies 48, 42 may supply a fixed voltage, as opposed to having charge-pump power amplifiers. In situations where an amplifier serves as the voltage supply 42, the amplifier may serve as a short-circuit current controller. In certain situations, it may be beneficial to use different amplifier configurations, or a different type of amplifier. In certain situations, it may be beneficial to include an amplifier that is configured to function within a common mode voltage range from the voltage supply 48 down to several volts below the voltage supply 48. The amplifier may be specifically designed to handle a high input common mode voltage as well as a low output common mode voltage.

In certain situations, it may be beneficial to include a voltage supply 48, 42 that provides 3.3 volts. Alternatively, the voltage supply 48, 42 may supply any other predetermined voltage level, including 5, 12, 14, 24, and 48 volts. In certain situations, it may be beneficial to use a vehicle battery for at least one of the voltage supplies 48, 42. In certain situations, it may be beneficial have at least one of the voltage supplies 48, 42 have a supply voltage within the range of 4.5 volts to 60 volts. In one non-limiting embodiment, the voltage supplies 48, 42 may be configured to increase the respective supplied voltages over a predetermined time (i.e. ramp voltage).

In one non-limiting embodiment, the disclosed system may be an integrated circuit on a single chip. The integrated circuit may use ⅓ of the chip surface area used by the charge-pump system as shown by FIG. 1. Alternatively, the disclosed system may use up to 99% of the chip surface area used by the charge-pump system as shown by FIG. 1. In certain situations, it may be beneficial to specifically include the sampling capacitor 58 within the integrated circuit on a single chip. In one non-limiting embodiment, the sampling capacitor 58 may be smaller than the capacitors associated with the charge-pump system shown by FIG. 1. In some non-limiting embodiments, the sampling capacitor may be within a capacitance range of 2 pF to 250 pF.

In one non-limiting embodiment, the number of pins included by the present disclosure may be less than the number of pins included by the charge-pump system as shown by FIG. 1. In one non-limiting example, the present disclosure may include one less pin than the charge-pump system as shown by FIG. 1. In another non-limiting example, the present disclosure may include up to three fewer pins than the charge-pump system as shown by FIG. 1.

In one non-limiting embodiment, the current sinks 82, 84, 86 may each control the amount of charge stored in the sampling capacitor 58. By selecting which of the current sinks 82, 84, 86 is operating, the slew rate of charging of the high-side switch 70 may also be selected. Accordingly, each of the current sinks 82, 84, 86 may correspond to a different slew rate charging of the high-side switch 70. The FET 60 may be used to short each of the current sinks 82, 84, 86 when slew rate control is not desired. By controlling the amount of charge stored in the sampling capacitor 58, control may be possible over the charge rate to the $V_{GS}$ of the high-side switch 70. When the FET 60 shorts the current sinks 82, 84, 86, the sampling capacitor 58 may reach a full charge, and the slew rate of charging the high-side switch 70 may be relatively higher. The slew rate of the high-side switch 70 may be programmable.

Figure 3:
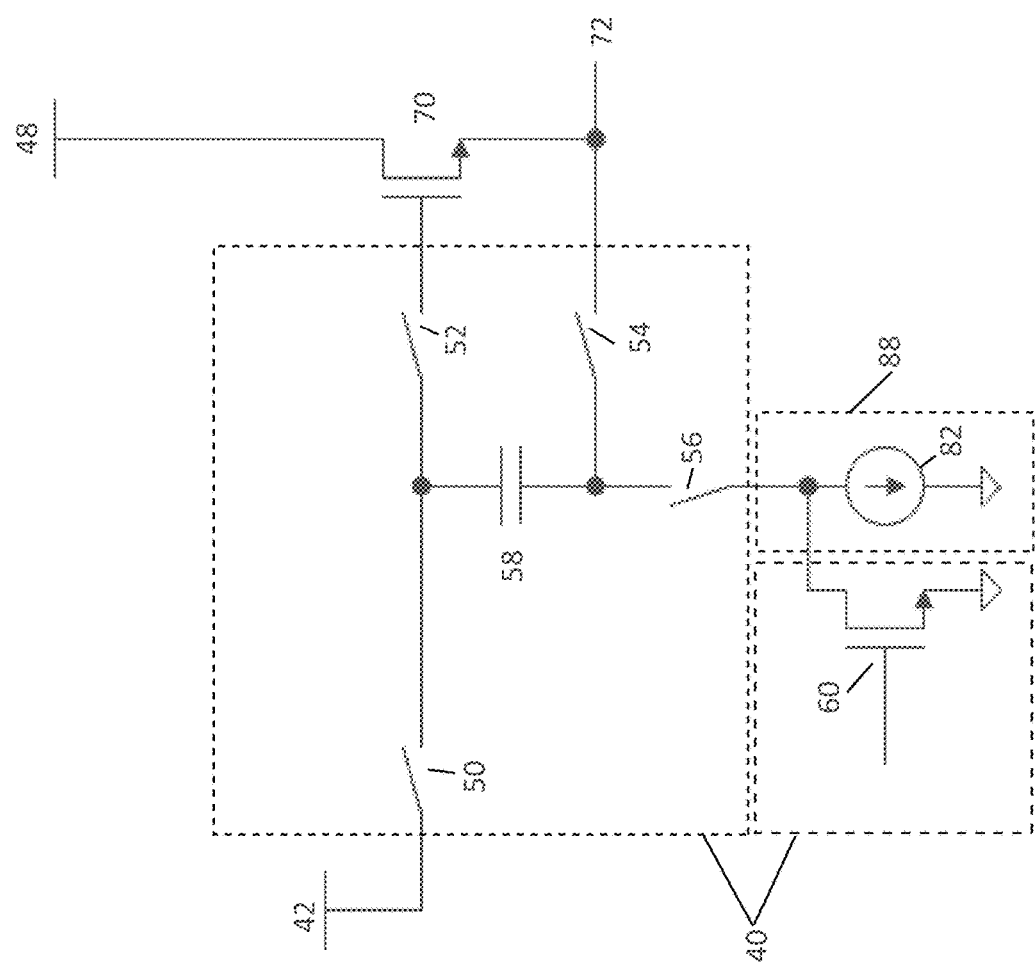
FIG. 3 is a circuit-level schematic of another embodiment of a system and method for controlling the slew rate of a high-side switch in accordance with the present disclosure.

FIG. 3 is a circuit-level schematic of another embodiment of a system and method for controlling a slew rate of a high-side switch in accordance with the present disclosure. In one embodiment, a sample and level-shift circuit 40 may be provided. The sample and level-shift circuit 40 may be connected to a voltage supply 42. The voltage supply 42 may be the output of an amplifier (for example, an operational amplifier). Alternatively, the voltage supply 42 may supply a fixed or variable supply voltage. In certain embodiments, it may be beneficial for the voltage supply 42 to be 1.8, 2.5, 3.3, or 5 volts. Alternatively, any other voltage level may be supplied by the voltage supply 42. The sample and level-shift circuit 40 may include a plurality of switches 50, 52, 54, 56. The sample and level-shift circuit 40 may further include a sampling capacitor 58. Additionally, the sample and level-shift circuit 40 may include a field-effect transistor (FET) 60. A slew control 88 may include at least one current sink 82 that may be tunable. The slew control 88 may be connected in parallel with the FET 60.

In one non-limiting example, as shown by FIG. 3, a high-side switch 70 may be an n-channel metal-oxide semiconductor field-effect transistor (nMOS transistor) or an n-channel laterally diffused metal oxide semiconductor transistor (nLDMOS transistor). An nLDMOS transistor is considered to be a type of nMOS transistor. In certain situations, it may be beneficial to use a different type of transistor. One output of the sample and level-shift circuit 40 may be connected to the gate side of the high-side switch 70. The drain side of the high-side switch 70 may be connected to a voltage supply 48. The output pin 72 may be connected to a circuit load. In certain non-limiting embodiments, a low-side switch may be included and connected to the output pin 72, such that the high-side switch 70 and the low-side switch constitute a half-bridge configuration.

Still referring to FIG. 3, the sample and level-shift circuit 40 may eliminate a need for a charge-pump when driving the high-side switch 70. The sampling capacitor 58 may sample the voltage of the voltage supply 42. The sampling capacitor 58 may then be used to charge the gate side capacitance of the high-side switch 70. The charging of the gate side capacitance may enable the high-side switch 70 to turn "on." In one non-limiting embodiment, when the high-side switch 70 is "on," an input voltage may be supplied to a circuit load.

In one non-limiting embodiment, the current sink 82 controls the amount of charge stored in the sampling capacitor 58. By selecting the current sink 82, the slew rate of charging of the high-side switch 70 may also be selected. The FET 60 may be used to short the current sink 82 when slew rate control is not desired. By controlling the amount of charge stored in the sampling capacitor 58, control may be possible over the charge rate to the $V_{GS}$ of the high-side switch 70. When the FET 60 shorts the current sink 82, the sampling capacitor 58 may reach a full charge, and the slew rate of charging the high-side switch 70 may be relatively higher. The slew rate of the high-side switch 70 may be programmable.

Referring to FIGS. 2 and 3, it becomes apparent that when at least one current sink 82 is implemented, it may become possible to implement any number of current sinks. Referring to FIG. 2, one non-limiting example embodiment includes three current sinks 82, 84, 86 connected in parallel. Alternatively, any number of current sinks connected in parallel may be included. Any of the current sinks 82, 84, 86 may be tunable and selectable.

Figure 4:
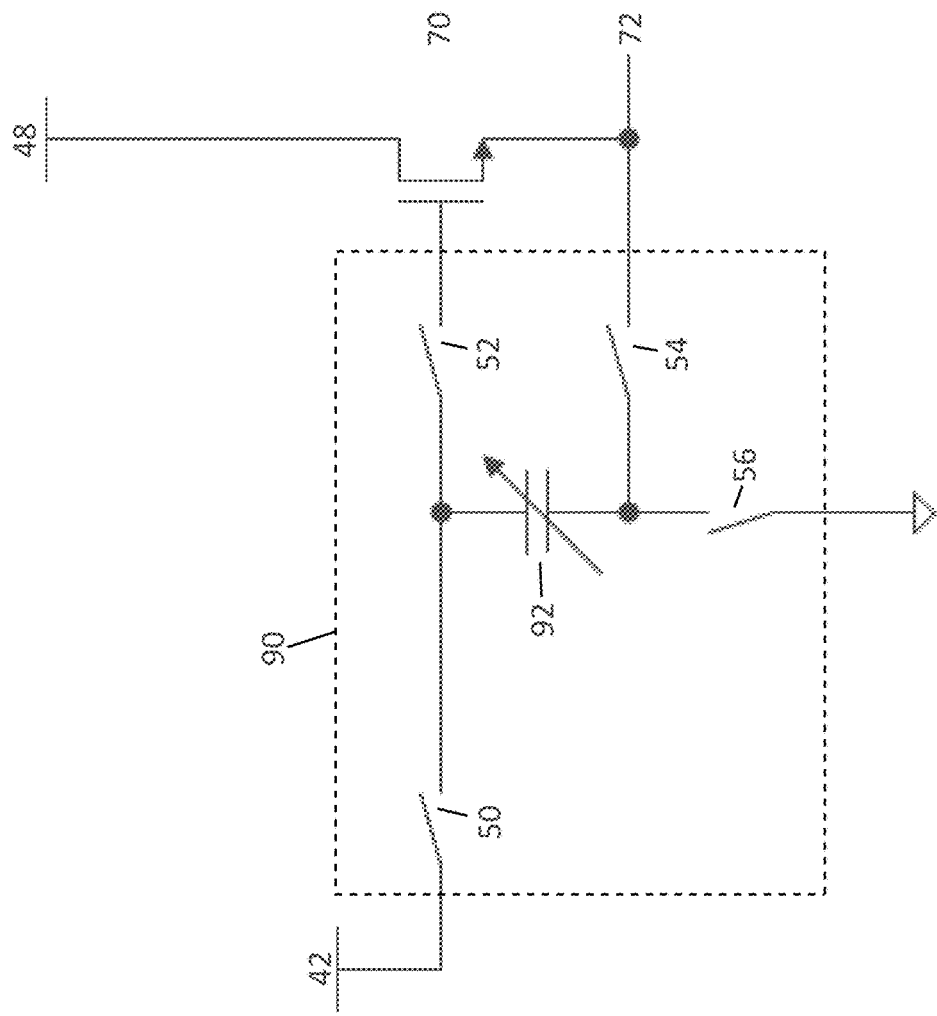
FIG. 4 is a circuit-level schematic of another embodiment of a system and method for controlling the slew rate of a high-side switch in accordance with the present disclosure.

FIG. 4 is a circuit-level schematic of another embodiment of a system and method for controlling a slew rate of a high-side switch in accordance with the present disclosure. In one embodiment, a sample and level-shift circuit 90 may be provided. The sample and level-shift circuit 90 may be connected to a voltage supply 42. The voltage supply 42 may be the output of an amplifier (for example, an operational amplifier). Alternatively, the voltage supply 42 may supply a fixed or variable supply voltage. In certain embodiments, it may be beneficial for the voltage supply 42 to be 1.8, 2.5, 3.3, or 5 volts. Alternatively, any other voltage level may be supplied by the voltage supply 42. The sample and level-shift circuit 40 may include a plurality of switches 50, 52, 54, 56. The sample and level-shift circuit 40 may further include a sampling capacitor 92. Slew control may be implemented via the sampling capacitor 92.

In one non-limiting example, as shown by FIG. 4, a high-side switch 70 may be an n-channel metal-oxide semiconductor field-effect transistor (nMOS transistor) or an n-channel laterally diffused metal oxide semiconductor transistor (nLDMOS transistor). An nLDMOS transistor is considered to be a type of nMOS transistor. In certain situations, it may be beneficial to use a different type of transistor. One output of the sample and level-shift circuit 40 may be connected to the gate side of the high-side switch 70. The drain side of the high-side switch 70 may be connected to a voltage supply 48. The output pin 72 may be connected to a circuit load. In certain non-limiting embodiments, a low-side switch may be included and connected to the output pin 72, such that the high-side switch 70 and the low-side switch constitute a half-bridge configuration.

Still referring to FIG. 4, the sample and level-shift circuit 90 may eliminate a need for a charge-pump when driving the high-side switch 70. The sampling capacitor 92 may sample the voltage of the voltage supply 42. The sampling capacitor 92 may then be used to charge the gate side capacitance of the high-side switch 70. The charging of the gate side capacitance may enable the high-side switch 70 to turn "on." In one non-limiting embodiment, when the high-side switch 70 is "on," an input voltage may be supplied to a circuit load.

In one non-limiting embodiment, the sampling capacitor 92 may be adjustable. In certain situations, it may be beneficial to include an adjustable sampling capacitor 92, as the sampling capacitor 92 may then be used as a charge-limiting mechanism. In this non-limiting embodiment, the sampling capacitance corresponds to the sample and level-shift circuit. Therefore, adjusting the capacitance of the sampling capacitor 92 may enable slew control of the high-side switch 70.

Figure 5:
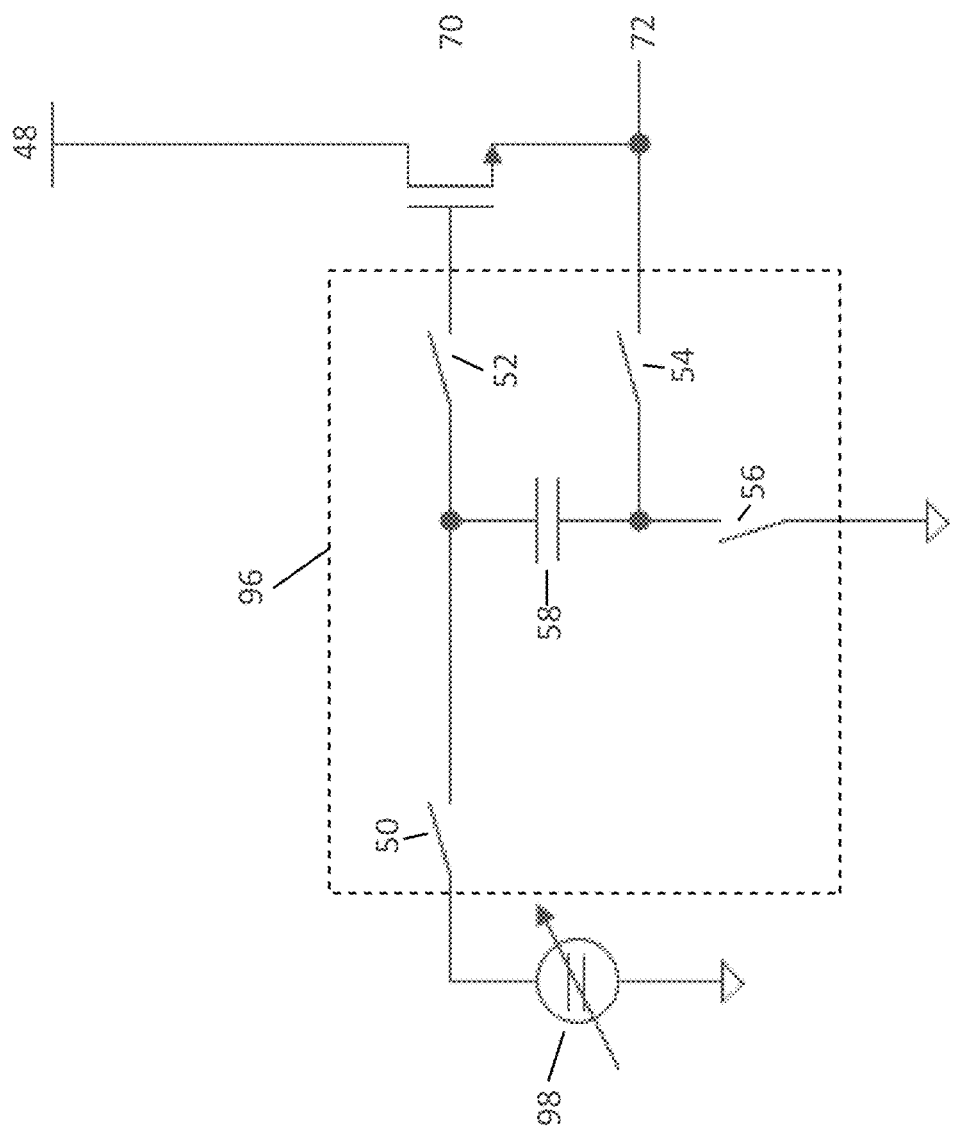
FIG. 5 is a circuit-level schematic of another embodiment of a system and method for controlling the slew rate of a high-side switch in accordance with the present disclosure.

FIG. 5 is a circuit-level schematic of another embodiment of a system and method for controlling a slew rate of a high-side switch in accordance with the present disclosure. In one embodiment, a sample and level-shift circuit 96 may be provided. The sample and level-shift circuit 96 may be connected to a voltage supply 98. The sample and level-shift circuit 98 may include a plurality of switches 50, 52, 54, 56. The sample and level-shift circuit 98 may further include a sampling capacitor 58.

In one non-limiting example, as shown by FIG. 5, a high-side switch 70 may be an n-channel metal-oxide semiconductor field-effect transistor (nMOS transistor) or an n-channel laterally diffused metal oxide semiconductor transistor (nLDMOS transistor). An nLDMOS transistor is considered to be a type of nMOS transistor. In certain situations, it may be beneficial to use a different type of transistor. One output of the sample and level-shift circuit 96 may be connected to the gate side of the high-side switch 70. The drain side of the high-side switch 70 may be connected to a voltage supply 48. The output pin 72 may be connected to a circuit load. In certain non-limiting embodiments, a low-side switch may be included and connected to the output pin 72, such that the high-side switch 70 and the low-side switch constitute a half-bridge configuration.

Still referring to FIG. 5, the sample and level-shift circuit 96 may eliminate a need for a charge-pump when driving the high-side switch 70. The sampling capacitor 96 may sample the voltage of the voltage supply 98. The sampling capacitor 96 may then be used to charge the gate side capacitance of the high-side switch 70. The charging of the gate side capacitance may enable the high-side switch 70 to turn "on." In one non-limiting embodiment, when the high-side switch 70 is "on," an input voltage may be supplied to a circuit load.

The voltage supply 98 may supply a fixed or variable supply voltage. In certain embodiments, it may be beneficial for the voltage supply 42 to be 1.8, 2.5, 3.3, or 5 volts. Alternatively, any other voltage level may be supplied by the voltage supply 42. In one non-limiting embodiment, the voltage supply 98 may be configured to increase the supplied voltage over a predetermined time (i.e. ramp voltage). In one non-limiting embodiment, the voltage supply 98 may be used as a charge-limiting mechanism. An adjustable voltage supply 98 may limit a voltage corresponding to charging the sampling capacitor. As such, the slew rate of the high-side switch may be controlled.

In one non-limiting embodiment, the slew control circuit may include other types of charge-limiting mechanisms. The charge-limiting mechanism may limit the sampled current of the sampling capacitor 58. In certain non-limiting embodiments, the charge-limiting mechanism may limit the sampled voltage of the sampling capacitor 58. The sampled current may be within the range 5 µA to 5 mA. The sampled voltage may be within the range 0% to 100% of the final target gate-source voltage. The charge-limiting mechanism may be configured to limit a frequency corresponding to a sample and level-shift circuit.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto. The entire disclosure of each patent and publication cited herein is incorporated by reference, as if each such patent or publication were individually incorporated by reference herein. Various features and advantages of the invention are set forth in the following claims.

What is claimed is:

1. A circuit for slew rate control for a high-side switch, the circuit comprising:
   a sample and level-shift circuit, the sample and level-shift circuit connected to the high-side switch;
   a charge-limiting circuit; and
   a sampling capacitor configured to:
      sample an input voltage corresponding to the sample and level-shift circuit; and
      charge a gate capacitance of the high-side switch; and
   wherein the charge-limiting circuit:
      includes a current sink configured to limit charge;
      includes a transistor connected parallel with the current sink, the transistor configured to remove any charge limitation corresponding to the current sink; and
      is configured to limit a rate of charge transferred to the gate capacitance of the high-side switch per unit of time;
   wherein the sample and level-shift circuit is a bootstrap circuit connected to a source of the high-side switch.

2. The circuit of claim 1, wherein the charge-limiting circuit is further configured to limit a current corresponding to the sampling capacitor.

3. The circuit of claim 1, wherein the charge-limiting circuit is further configured to limit a voltage corresponding to the sampling capacitor.

4. The circuit of claim 1, wherein the charge-limiting circuit is further configured to limit a sampling capacitance corresponding to the sample and level-shift circuit.

5. The circuit of claim 1, wherein the charge-limiting circuit is further configured to limit a frequency corresponding to the sample and level-shift circuit.

6. The circuit of claim 1, wherein the high-side switch is an n-channel metal-oxide semiconductor field-effect transistor (nMOS transistor).

7. The circuit of claim 1, wherein the slew rate control circuit for the high-side switch is an integrated circuit on a single chip.

8. The circuit of claim 1, wherein the charge-limiting circuit includes an adjustable voltage supply.

9. The circuit of claim 1, wherein the charge-limiting circuit includes the sampling capacitor.

10. The circuit of claim 1, wherein:
the sampling capacitor is an adjustable sampling capacitor; and
the charge-limiting circuit includes the sampling capacitor.

11. The circuit of claim 1, wherein:
the high-side switch is an n-channel metal-oxide semiconductor field-effect transistor (NMOSFET) connected to a power supply at a drain of the NMOSFET;
the power supply is configured to provide a voltage at least as great as the input voltage; and
the NMOSFET is configured to be switched on when the power supply provides the voltage at least as great as the input voltage.

12. The circuit of claim 1, wherein:
the input voltage is sampled at a first side of the sampling capacitor;
the charge-limiting circuit is connected between a second side of the sampling capacitor and ground; and
the first side of the sampling capacitor is on an opposite side of the sampling capacitor as compared to the second side of the sample capacitor.

13. The circuit of claim 1, wherein the bootstrap circuit connected to the source of the high-side switch includes a connection between a bottom plate of the sampling capacitor and the source of the high-side switch.

14. The circuit of claim 1, wherein the sample and-level circuit is configured to dynamically adjust a voltage of a gate of the high-side switch based upon output of the high-side switch.

15. A method for controlling a slew rate of a high-side switch, the method comprising:
supplying an input current to a sample and level-shift circuit;
sampling an input voltage with a sampling capacitor configured for the sampling of the input voltage;
level-shifting the input voltage;
charging a gate capacitance of the high-side switch using the sampling capacitor; and
limiting a charge supplied to the sampling capacitor, the charge limited by at least one current sink;
connecting a bootstrap circuit to a source of the high-side switch; and
connecting a transistor in parallel with the at least one current sink, and turning on the transistor to remove any charge limitation corresponding to the at least one current sink.

16. The method of claim 15, further comprising selecting one of the at least one current sink, each of the at least one current sink corresponding to a different high-side switch slew rate.

17. The method of claim 15, further comprising limiting a current corresponding to the sampling capacitor.

18. The method of claim 15, further comprising limiting a voltage corresponding to the sampling capacitor.

19. The method of claim 15, further comprising limiting a sampling capacitance corresponding to the sample and level-shift circuit.

20. The method of claim 15, further comprising limiting a frequency corresponding to the sample and level-shift circuit.

21. A switch apparatus, comprising:
a high-side switch; and
a control circuit for slew rate control for a high-side switch, the control circuit comprising:
a sample and level-shift circuit, the sample and level-shift circuit connected to the high-side switch;
a charge-limiting circuit; and
a sampling capacitor configured to:
sample an input voltage corresponding to the sample and level-shift circuit; and
charge a gate capacitance of the high-side switch; and
wherein:
the charge-limiting circuit configured to limit a rate of charge transferred to the gate capacitance of the high-side switch per unit of time, including:
a current sink configured to limit charge;
a transistor connected parallel with the current sink, the transistor configured to remove any charge limitation corresponding to the current sink; and
the sample and level-shift circuit is a bootstrap circuit connected to a source of the high-side switch.

* * * * *

UNITED STATES PATENT AND TRADEMARK OFFICE
CERTIFICATE OF CORRECTION

PATENT NO. : 10,516,333 B2  
APPLICATION NO. : 15/916421  
DATED : December 24, 2019  
INVENTOR(S) : Ramalingam et al.

Page 1 of 1

It is certified that error appears in the above-identified patent and that said Letters Patent is hereby corrected as shown below:

On the Title Page

<u>Add the following:</u>
(30) Foreign Application Priority Data
Apr. 10, 2017 (IN) ................................................201711012738

Signed and Sealed this
Twelfth Day of May, 2020

Andrei Iancu
*Director of the United States Patent and Trademark Office*